United States Patent [19]

Movchan et al.

[11] Patent Number: 5,834,070

[45] Date of Patent: Nov. 10, 1998

[54] METHOD OF PRODUCING PROTECTIVE COATINGS WITH CHEMICAL COMPOSITION AND STRUCTURE GRADIENT ACROSS THE THICKNESS

[75] Inventors: Boris A. Movchan; Jury E. Rudoy; Igor S. Malashenko, all of Kiev, Ukraine

[73] Assignee: International Center for Electron Beam Technologies of E.O. Paton Electric Welding Institute, Kiev, Ukraine

[21] Appl. No.: 832,276

[22] Filed: Apr. 3, 1997

[30] Foreign Application Priority Data

Apr. 4, 1996 [UA] Ukraine ................................. 96041326

[51] Int. Cl.⁶ ....................................................... B05D 3/06
[52] U.S. Cl. ...................... 427/566; 427/567; 427/126.1; 427/126.2; 427/126.3
[58] Field of Search ..................... 427/566, 567, 427/126.1, 126.2, 126.3

[56] References Cited

U.S. PATENT DOCUMENTS

| | | |
|---|---|---|
| 4,248,940 | 2/1981 | Goward et al. . |
| 4,676,994 | 6/1987 | Demaray ..................................... 427/42 |
| 5,238,752 | 8/1993 | Duderstadt et al. ..................... 428/623 |
| 5,296,274 | 3/1994 | Movchan et al. . |
| 5,418,003 | 5/1995 | Bruce et al. .......................... 427/126.2 |
| 5,514,482 | 5/1996 | Strangman .............................. 428/623 |
| 5,538,796 | 7/1996 | Schaffer et al. ........................ 428/469 |
| 5,698,273 | 12/1997 | Azad et al. ............................. 427/566 |

OTHER PUBLICATIONS

G.C. Riddle, "Evaporated Cermet Materials", IEEE Transactions on Parts Materials and Packaging, vol. 3, No. 4, Dec. 1967, pp. 154–161.

R.V. Lang et al, "Development of Compositionally Graded Thermal Barrier Coating Using Ion Assisted Electron Beam Co–Evaporation", 3rd International SAMPE Metals Conference, Oct. 20–22, 1992, pp. 266–277.

*Primary Examiner*—Roy V. King
*Attorney, Agent, or Firm*—Alix, Yale & Ristas, LLP

[57] ABSTRACT

The invention relates to the production of protective coatings for parts of gas turbines and internal combustion engines which are to be subjected to thermal loading. A coating formed in accordance with the invention has a chemical composition and structure gradient across its thickness and an outer ceramic layer. The coating is obtained by electron beam heating of a mixture of metals (alloys) and oxides which have different vapor pressures at the evaporation temperature, the mixture and an underlying ceramic ingot being serially evaporated and subsequently condensed on the part to be coated.

20 Claims, 5 Drawing Sheets

METHOD OF PRODUCING PROTECTIVE COATINGS WITH CHEMICAL COMPOSITION AND STRUCTURE GRADIENT ACROSS THE THICKNESS

BACKGROUND OF THE INVENTION

1. Field of the Invention

The present invention relates to the production of oxidation and/or corrosion resistant high temperature materials and, particularly, to the provision of protective coatings on substrates, components of gas turbines and internal combustion engines for example, which are to be subjected to thermal loading. More specifically, this invention is directed to the formation of protective coatings which are characterized by a chemical composition and structure gradient across their thickness and also by an outer ceramic layer and, especially, to the application of electron beam technology to the production of such functionally gradient coatings in a process wherein metals/alloys and chemical compounds (oxides) having different melting temperatures and vapor pressures are evaporated and subsequently condensed on a substrate in a vacuum. Accordingly, the general objects of the present invention are to provide novel and improved methods of such character.

2. Description of the Prior Art

Functionally gradient coatings, i.e., FG Coats, are characterized by a continuous, i.e., smooth, or discrete, i.e., laminated or step-wise, change in their chemical composition and structure across the thickness of the coating. Such variations in chemical composition and structure can be obtained by a number of different processes.

Yu A. Tamarin, in the publication entitled "Oxidation-Resistant Diffusion Coatings for GTE Blades", see M. Mashinostoenie, 1978, pg. 134, discusses a well-known method for the production of a protective coating having a chemical and phase composition gradient across its thickness. The diffusion technique reported by Tamarin employs a chemical-thermal treatment. Coatings produced by this diffusion methodology are characterized by low thermal stability under high temperature conditions. Such coatings, accordingly, cannot be employed to provide protection for the blades of gas turbines.

Other known methods for producing protective coatings employ air plasma spray technology (APS), vacuum-plasma spray technology (VPS, LPPS) and electron beam physical vapor deposition (EB-PVD). These other methodologies have been employed to produce coatings which may be generally characterized as of the overlay or independent layer.

The use of several plasmatrons to produce a coating has also previously been proposed. In this regard, for example, reference may be had to published PCT Patent Application No. U.S. 93/05005. In the technique disclosed in this application, the deposition of thermal barrier and wear-resistant coatings is effected by the exercise of computer control over the plasmatron operating modes. This computer control is alleged to provide a variable concentration of the hardening phase MeX, where X is oxygen, from 0% at the substrate to 60–80–100% optimal value at the external surface of the coating. The disclosed method requires considerable power and is very labor-intensive. More importantly, the disclosed method lacks the ability to stabilize the plasmatron operating modes for precise production of a composition and structure gradient across the thickness of the protective coating.

A method for the production of a thick, i.e., $\delta \leq 2$ mm, gradient coating consisting of separate microlayers, each microlayer being approximately 70 $\mu$m thick, with a flat interface between the layers is described by S. Sampath et al in "Thermal Spray Processing of FGMs/MRS Bulletin, 1995, 20, 1, pages 27–29. In this method, the computer control of a single plasmatron with two separate feeders allegedly results in the deposition of a NiCr—($ZrO_2$-8% $Y_2O_3$) gradient coating having 100% ceramic at the surface. Summary thickness of the coating reaches 800 $\mu$m. However, coatings built-up from microlayers have a short service life because the flat interface between the separate layers creates a favorable condition for microcrack formation and growth and, as a result, the coatings fail during thermal cycling.

In an effort to increase the durability of a thermal barrier coating (TBC) having a thickness $\delta \leq 250$ $\mu$m which are produced by air plasma spray technology, the bond coat surface, for example Ni-10Co-18Cr-6.5Al-0.3Y, may be subjected to additional aluminizing in order to obtain, in the external layer, a $\beta$-(Ni,Co)Al type intermetallic structure with aluminum gradient across its thickness, the Al content at the layer surface reaching 26–30%. This technique is claimed to have increased the durability of the TBC outer ceramic layer at cyclic temperature changes in the range of 1135↔50° C. (cycle time one hour) from 70 to 210–170 thermal cycles. This technique is reported by D. J. Wortman et al in an article entitled "Bond Coat Development for Thermal Barrier Coating", Trans. ASME, J. Eng. for Gas Turbines and Power, 1990, 112, 10, pages 527–530.

Similar MeCrAlHf and MeCrAiHfPt coatings with a gradient across the thickness, produced by the combination of electron beam evaporation of MeCrAl standard alloys and subsequent hafnium and platinum ion condensation or cathode spraying, are described in U.S. Pat. No. 4,123,595. Also, in U.S. Pat. No. 4,101,715, a method of platinum deposition on a condensed CoCrAlY coating by electroplating, followed by a further thermal treatment in vacuum, is proposed. The patented techniques are said to considerably increase the corrosion resistance of high-temperature alloys having a platinum distribution gradient across the thickness of the top layer of a COCrAlYPt coating. The corrosion resistance of platinum-containing coatings is, however, improved at the expense of a wetting decline of the $Al_2O_3$ film by the salt melt. The drawback of the patented methods, accordingly, is that the resulting coating has high thermal conductivity and insufficient thermal stability when subjected to multiple thermal cycles.

In order to increase the thermal cycle durability of three layer metal/ceramic coatings of the MeCrAlY/$ZrO_2$-8%$Y_2O_3$ type, an intermediate 30–40 $\mu$m thick single-phase "plastic" layer is introduced between the substrate and the primary oxidation-resistant layer. This intermediate layer provides an aluminum concentration gradient across the layer thickness from 3.5–5% at the surface of the protective alloy to 11–13% on the oxidation-resistant bond coat surface. This approach is accomplished through the successive electron beam evaporation of various chemical composition alloys from two independent sources in the same vacuum chamber and is disclosed in U.K. Patent 2252567, German Patent 4103994 and Italian Patent 1247155.

U.S. Pat. No. 4,321,311 discloses a method of production of a ceramic coating with an intermediate bond coat through the application of electron beam evaporation in a vacuum, the coating establishing a high adhesive strength bond with a substrate. In this patented technique, a Ni—Co—Cr—Al—Y bond coat is produced by plasma spraying in the atmosphere or by vacuum plasma spraying in wet hydrogen or low vacuum and with a possible introduction of oxide phase disperse particles into an intermediate metal layer to increase thermal stability. In U.S. Pat. Nos. 4,405,660 and 4,414,249, it is proposed to polish the NcCoCrAlY bond coat produced by VPS and to subsequently treat the coat in an oxydizing atmosphere with oxygen dosage injection to form a fine-grained 0.5–1.5 μm thick $Al_2O_3$ film which will firmly adhere to the substrate, there being a metal/ceramic transition zone before electron beam deposition of a $ZrO_2$-7%$Y_2O_3$ ceramic thermal barrier coating having a thickness in the range of 125–1250 μm.

In the interest of increasing the durability of a thermal barrier coating having an external ceramic layer comprised of partially stabilized zirconia produced by EB-PVD in a vacuum, U.S. Pat. Nos. 4,880,614 and 5,015,502 suggest the formation of an intermediate uniform porous-free interlayer of high purity $Al_2O_3$ oxide of 1 μm thickness by an undisclosed chemical condensation procedure. This technique requires, in order to achieve the desired structure gradient of the external thermal barrier layer, the additional step of laser fusion of the surface of the ceramic layer.

The above-discussed methods are considerably awkward, i.e., difficult to implement, and required expensive equipment and long duration, i.e., 4–8 hours, processing in order to produce an $Al_2O_3$ barrier layer at the surface of the coating.

K. J. Schmitt-Thomas et al, in the publication entitled "Thermal Barrier Coatings With Improved Oxidation Resistance", Surface & Cont. Technology, 1994, 68/69, pages 113–115, discuss the possibility of production of thermal barrier layers from 2–5 μm thick alumina by reactive sputtering in a vacuum from a separate source. In this proposed technique, an oxide film would be formed on the surface of oxidation-resistant coatings of Ni—Cr, Ni—Cr—Al, MeCrAlY (Co-31Ni-21 Cr-8Al-0.3Y) produced by LPPS methods. It is theorized that the methodology discussed in this article would result in an increase in the bond coat scaling resistance and the resistance to spallation of plasma-sprayed ceramic coatings comprising stabilized zirconia.

U.S. Pat. No. 4,676,994 describes a method for the production of a protective coating with a chemical composition and structure gradient across its thickness and an outer ceramic layer. In the technique described in this patent, the outer ceramic layer is produced by electron beam evaporation of a stabilized zirconia ingot with the resulting vapor being condensed on a substrate which was preliminarily coated with a heat resistant McCrAlY bond coat having an adaptive layer on the alumina base. Thus, a gradient coating having an outer ceramic layer comprised of stabilized zirconia with various grain size and ceramics density is obtained. The density of the ceramic layer, which has a thickness in the range of 2–3 μm, adjacent to the bond intermediate layer is 96% from theoretical and is reached at a 0.5 μm/min deposition rate of the vapor flow of stoichometric zirconia.

The method described immediately above permits production of two, three and multilayer compositional coatings having, as a rule, flat metal/metal+oxide or oxide/oxide interfaces. However, the differences in physical-chemical properties of the layers, and of their thermal coefficients of linear expansion (TCLE), differences in Young's modulus and irreversible oxidation reactions (gas corrosion) at the interfaces during operation will result in premature fracture, such fracture occurring mainly in the ceramic layer.

Elimination or restriction of undesirable physical-chemical processes at metal/ceramics interfaces of multilayer protective coatings can be achieved by the creation of a protective coating having a discrete, i.e., smooth, change in composition and structure while transitioning from one layer to another. Such coatings can be obtained by the EB-PVD method through evaporation of multicomponent mixtures from one source. Such mixtures contain substances with different vapor pressures at the evaporation temperature. In the paper "The Direct Evaporation of Alloys", G. Zinsmeister, Vakuum-Technic., 1964, No. 8, pages 233–237, it is reported that evaporation of a two-component melt always starts with the component having the higher vapor pressure. Subsequently, with the increase of evaporated quantity, evaporation of the component with the lower vapor pressure will occur. The higher the concentration of the element with the higher vapor pressure in the evaporated mixture, the stronger these differences are shown. As a result of the change sequence of the vapor phase composition in the evaporation and condensation process, a component concentration gradient across the thickness of a coating formed on a substrate will occur. Thus, the component having the higher vapor pressure will predominate in the deposited material which is disposed adjacent to the substrate.

SUMMARY OF THE INVENTION

The present invention overcomes the above-discussed and other deficiencies and disadvantages of the prior art and, in so doing provides a novel and improved method for the formation, on a substrate, of a coating having a gradient of chemical composition and structure across its thickness and having an external ceramic layer. In the practice of this novel method, a mixture of metals (alloys) and oxides with different vapor pressures at the evaporation temperature are preliminarily disposed on the surface of a ceramic ingot comprised of stabilized zirconia. The ingot is then placed in a water-cooled crucible and, the use of controlled electron beam heating, the material disposed on the ingot and, finally, the material comprising the ingot itself are subsequently evaporated. The evaporated materials condensed on a heated substrate to form the desired coating.

In accordance with the present invention, the mixture of metal/alloys (and oxides) may either be deposited as a layer on the top side of the ceramic ingot or may be applied to the ingot in the form of a pressed and vacuum annealed metal-ceramic pellet. In either case, the mixture of metals (alloys) and oxides is positioned so as to be impacted by the electron beam employed to transfer energy to, and thereby cause evaporation of, the mixture and the ingot.

In the practice of the invention, to realize condensation at a relatively low substrate temperature without adhesion degradation, a layer of metals (alloys) and oxides comprising an Al—$Al_2O_3$—$ZrO_2$ system is deposited on the top side of the ceramic ingot, the deposited system having the following component content (% by weight):

Al—5–40,
$Al_2O_3$—1–60,
$ZrO_2$—the rest.

To improve substrate wettability by the condensed material, a layer of metals (alloys) and oxides comprising an Al—Si—Y—Al—$Al_2O_3$—$ZrO_2$ system having the following component content (% by weight) is deposited on the top side of the ceramic ingot:

Al—5–40,
Si—0.3–3,
$Al_2O_3$—3–84,

Y—0.1.5,

ZrO$_2$—the rest.

To increase bond coat reliability, a layer of metals (alloys) and oxides comprising an Al—Cr—Ni—Al$_2$O$_3$—Y—ZrO$_2$ system having the following component content (% per weight) is deposited on the top side of the ceramic ingot:

Al—2–18,

Cr—5–40,

Ni—0–40,

Al$_2$O$_3$—2–58,

Y—0–1.5,

ZrO$_2$—the rest.

To increase corrosion resistance of the gradient coating, a layer of metals (alloys) and oxides comprising an Al—Cr—(Ni,Co)—Al$_2$O$_3$—Y—Pt—ZrO$_2$ system having the following component content (% per weight) is deposited on the top side of the ceramic ingot:

Al—4–12,

Cr—10–25,

Ni—25–45,

Co—25–45,

Al$_2$O$_3$—1–60,

Y—0.5–2.5,

Pt—0.5–2.5

ZrO$_2$—the rest.

Application to the top side of an ingot comprised of stabilized zirconia of the mixture of metals (alloys) and oxides having various vapor pressures at the evaporation temperature permits the creation, on a substrate, of multilaminate protective coatings with a discrete (smooth) change of the coating composition and structure across the thickness of the coating while transitioning from the substrate to the outer surface of the coating. This effect is reached by fractionating of the component mixture of a definite composition in the process of its EB heating and evaporation from one crucible.

In the Al—Al$_2$O$_3$—ZrO$_2$ system the evaporation of Al at the first moment of the electron beam affect on the layer or pellet has resulted in condensation at a temperature which is 30°–50° C. lower than usual without adhesion degradation. The presence of Al in the gradient coating internal "layer" compensates for Al$_2$O$_3$ partial dissociation at the initial moment of EB heating. This improves sintering of the Al$_2$O$_3$ thin oxide "layer" which transfers smoothly over the eutectic point into the zirconia layer, the zirconia having high erosion resistance and heat-insulation effect even in small thicknesses (3–5 μm). The thin zirconia layer is characterized by a fine-grained structure and high fracture viscosity and has a stable chemical connection with Al$_2$O$_3$ in solid state.

When using the Al—Si—Y—Al$_2$O$_3$—ZrO$_2$ system, small additions of silicon, 1–3% by weight, improve the substrate's wettability by the condensed material. This improved wettability will increase the coating adhesion to high temperature nickel alloys. The silicon also increases the resistance to gas corrosion of the substrate-gradient coating diffusion zone and, in complex with the Al$_2$O$_3$ oxide, has provided a two-three times durability increase of the gradient condensed coating under thermal cycles at 1100°–1150° C. maximal environmental (gas flow) temperature.

However, silicon diffusion into superalloy substrates can decrease the creep resistance of the substrate-coating diffusion zone material. Therefore, for stable operation at high temperature, an Al—Cr—Ni—Y—Al$_2$O$_3$—ZrO$_2$ system may be employed where the external ceramic layer transitions into a thermal barrier/layer produced by a subsequent evaporation of the pellet and of a ceramic ingot of partially stabilized zirconia of a standard chemical composition ZrO$_2$—(7–8)% Y$_2$O$_3$.

A considerable increase in the corrosion resistance of a gradient coating in accordance with the invention may be obtained by additional introduction of 0.5–2.5% platinum into the evaporated mixture (Al—(Ni,Co.)—Cr—Al$_2$O$_3$—Y—Pt—ZrO$_2$ system), especially in an atmosphere containing natrium chloride and natrium sulfite. Platinum addition has, by a factor of 1.5–2, increased the gradient coating resistance to salt corrosion, stabilized the protective function of the Al$_2$O$_3$—ZrO$_2$ ceramic layer and restricted diffusive mobility of separate components in the gradient structure of a condensed protective coating produced by evaporation directly from the pellet.

Vacuum evaporation of a prescribed quantity or a final weight of heat-resistant materials with different vapor pressures from one source, in accordance with the invention, is the most acceptable method for the production of a gradient coating and, in particular, TBCs with top ceramic layer.

The above-proposed coating systems are canonical in the anti-corrosion protection of substrates, i.e., items operating at high temperature in aggressive gas flows.

In accordance with the present invention, during electron-beam heating of the mixture carried by the ingot and the ceramic ingot itself, when a definite temperature is reached, evaporation of the mixture components, which form a transition gradient zone, takes place. The evaporation of the mixture transitions smoothly into evaporation of the ceramic ingot itself, the material evaporated from the ingot forming the external thermal barrier layer or region of the gradient coating.

The smooth gradient of chemical composition and structure of the protective layer across the thickness of the protective coating provides better correlation of thermal-physical characteristics (thermal coefficient of linear expansion, Young's modulus, etc.) of the structural components of oxidation-resistant (corrosion-resistant) or thermal barrier coatings comprising stabilized zirconia. This, in turn, results in high corrosion- and thermal-cyclic durability of high temperature alloy components which are provided with a protective gradient coating in accordance with the invention.

In accordance with the present invention, it is possible to obtain a thin (δ≈5–8 μm) protective gradient coating with an external zirconia layer. The protective gradient coating with the external zirconia layer is characterized by high density, reliable adhesion to the protected surface, resistance to abrasive wear and low surface roughness (R$_a$, 0.5 μm) of the ceramic layer.

BRIEF DESCRIPTION OF THE DRAWINGS

Certain embodiments of the invention will now be described by way of example only with reference to the accompanying drawings wherein.

DESCRIPTION OF THE DISCLOSED EMBODIMENTS

Figure 1:
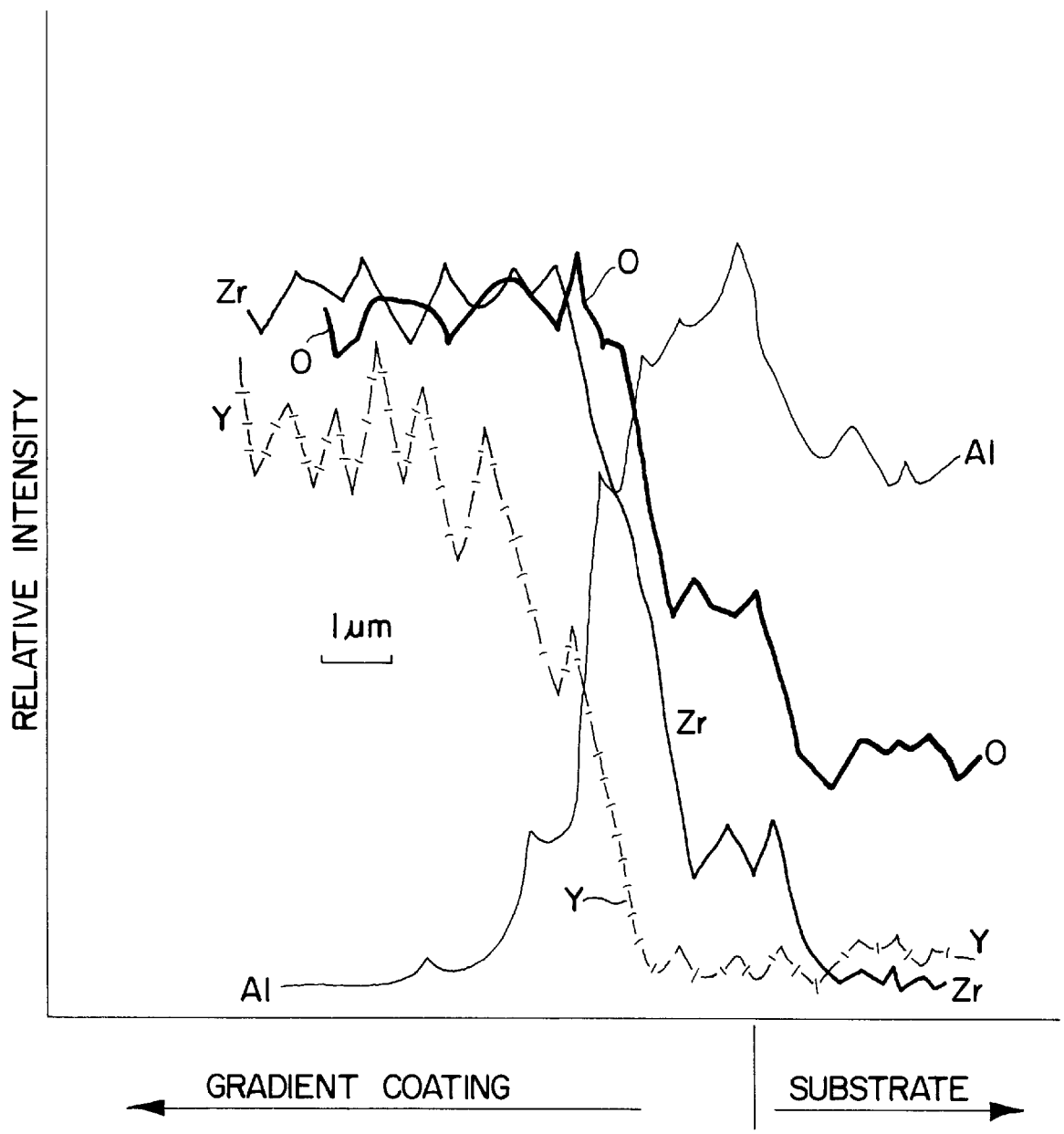
FIG. 1 shows an example of the element distribution curves of the separate constituents across the thickness of condensed protective coatings, with a gradient in composition and structure, produced by direct evaporation from a crucible of a mixture of 13%Al-7%Al$_2$O$_3$-79%(ZrO$_2$-7%Y$_2$O$_3$) placed (fixed) at the top side of a ceramic ingot in the form of a sintered pellet.

The method of formation a substrate of a protective coating with a chemical composition and structure gradient across the coating thickness and a top ceramic layer in accordance with the invention consists of the following: on the top side of a ceramic ingot, the ingot preferably being comprised of stabilized zirconia (ZrO$_2$-7%Y$_2$O$_3$), which is to be evaporated from a copper water-cooled crucible, a mixture of metals (alloys) and oxides Al$_2$O$_3$ and ZrO$_2$ is applied either by plasma spraying or in the form of a pressed and vacuum annealed metallic-ceramic pellet. The components of the mixture have various vapor pressures at the evaporation temperature of the ingot. The amounts of the constituents of the mixture to be applied to the ceramic ingot are chosen depending on the required coating thickness.

Before plasma deposition of the mixture as a layer on the top side of the ceramic ingot, the ingot is annealed in a muffle furnace, for example, at 650° C. For the layer deposition, Kiev-7 plasma-arc apparatus may be used. The temperature of the top side of the ceramic ingot during the mixture deposition will be in the range of 150°–180° C. The deposition process parameters are maintained constant: power—32 kW, arc current—400 A (voltage—80 V). The distance from the nozzle cut to the top side of a ceramic ingot installed in special tooling was, in one reduction to practice, 80 mm. After the mixture of metals and oxides has been applied to the top side of the ingot, the latter is placed in a forevacuum chamber (p=1.10$^{-1}$ Pa) for vacuum degassing at 250°–280° C., 1.5 h to remove moisture from the ceramic ingot and gases from the plasma-deposited metallic-ceramic mixture. The coated ingot will subsequently be held in the low pressure environment until its transfer into the evaporator of an electron beam coater.

Before applying the mixture of metals and oxides on the top side of the ceramic ingot in the form of a pellet, the latter is preliminary sintered and vacuum calcinated at 580°–600° C. Such temperature is chosen to provide mechanical strength of the pellet. The ceramic ingot with the pellet is also vacuum calcinated at 250°–280° C., 1.5 h, to remove moisture from the ceramic ingot.

After completion of the above-descried steps, the ceramic ingot with coated top side (or with the pellet placed on its top side) is placed into a water-cooled copper crucible in a main (coating) chamber which is subsequently pumped out (evacuated). Standard electron-beam equipment (UE-143M, UE-237, UE-204 and other type units) having 17.5–20 kV operating voltage and beam current which may be varied in the range from 0.1 to 2.8 A is employed.

When the residual gas pressure in the main coating chamber reaches a level of not more than $1.10^{-4}$ Hg mm (1.13 $0.10^{-2}$ Pa), the electron beam is focused at the ingot placed in the crucible. The kinetic energy of the electrons which impact on a target, i.e., the ingot or a mixture interposed between the ingot and the beam source, is transformed into thermal energy due to deceleration by the "target" surface. This results in electron-beam heating of the ingot's top side which was preliminary coated with the mixture (or on which the pellet was placed). Thermal energy released in the volume of the mixture applied at the top side of the heated ceramic ingot is increased up to the start of melting and evaporation.

Evaporation of the ZrO$_2$-7%Y$_2$O$_3$ ceramic ingot starts simultaneously with the end of evaporation of the mixture layer or pellet applied at the ingot top side.

By the above-described method, using the fractionating effect of the composition component mixture in the process of EB heating in a single evaporator (crucible), condensed coatings with a chemical composition and structure which varies across their thickness are obtained. The initial "layers" of the coating, i.e., the coating region adjacent to the substrate, should be enriched with a more light volatile component. In the case of thermal resistant and thermal barrier coatings, this component will preferably be aluminum or chromium. In the intermediate "layers" of the coatings, the components with lower vapor pressure and higher melting temperature prevail, for example, silicon, alumina, ceria, yttria and platinum. At the final stage of protective coating formation, i.e., during formation of its external "layers" or region, primary evaporation and condensation of substances with maximal high melting temperature, for example, yttria and zirconia, takes place. Using ZrO$_2$-7%Y$_2$O$_3$ powder stabilized at the molecular level as zirconia, evaporation and condensation of the vapor flow of initial composition ZrO$_2$—Y$_2$O$_3$ ceramics take place.

Thus, a ceramic thermal barrier layer of zirconia up to 250 $\mu$m thick is obtained on the protected surface without any sharp composition and structure gradient variations across the thickness of the protective coating.

The essence of the disclosed invention is illustrated by experimental data, i..e, thermal cyclic tests of specimen pins, which demonstrate the formation of coatings with a chemical composition and structure gradient across their thickness by evaporation of the metal-ceramic plasma-sprayed mixtures applied to the top side of ZrO$_2$-7%Y$_2$O$_3$ ceramic ingots, as well as pressed and sintered metal powders, heat resistant alloys and oxides. Gradient coatings having a thickness of 6–8 $\mu$m were obtained on stationary substrates, i.e., specimen pins, by evaporation and condensation of 6–15 g pellets. The same thickness coatings with a 135–150$\mu$m thick top ceramic layer are produced on rotating substrates by evaporation of 30–45 g pellets and a standard $ZrO_2$-7%$Y_2O_3$ ceramic ingot (initial density 4±0.1 g/cm$^3$) as well as by evaporation of $ZrO_2$-7%$Y_2O_3$ ceramic ingots having a layer of metals and alumina and zirconia plasma-sprayed at their top sides.

To obtain oxidation-resistant gradient coatings, a vapor phase was condensed on EP-99 nickel alloy substrates. The substrates were used either without any intermediate coating or with a Ni-22Co-18Cr-11Al-(Y) oxidation-resistant intermediate coating. The substrate temperature during condensation of the coating was 850°–900° C.

Pins removed from the furnace were cooled to room temperature by an intensive air flow at a cooling rate of 185°/min cooling rate (within 6–10 min.). Time to rupture (number of thermal cycles) of the top ceramic layer corresponded to corrosion spot or star microcrack appearance, observed by the naked eye, or to ceramics spalling from 10% of the working surface of the test specimens.

EXAMPLE 1 Al—$Al_2O_3$—$ZrO_2$ System

A protective coating characterized by a chemical composition and structure gradient across its thickness was formed on a heated substrate in a vacuum by first producing a base from which the coating was subsequently evaporated. This base comprised a ceramic ingot and, particularly, a zirconia ingot having a 500±20 g mass. A layer containing by weight 13% metallic aluminum, 7%$Al_2O_3$ and 80% ($ZrO_2$-7% $Y_2O_3$) and having a thickness of 3.2–3.6 mm was formed on the top surface of the ingot. This layer of metal and oxides was produced by plasma arc deposition of a stabilized solid solution in the form of a powder mixture. The deposited layer had a mass in the range of 30–38 g. The ingot with the surface layer was placed in a vacuum furnace and the temperature was increased to 630° C. over a period of two hours. During this heating step, localized melting of the layer does not occur. After the heat treatment, the ingot was placed in a water-cooled crucible with the deposited layer on top. A substrate to be coated and the crucible were properly positioned in the vacuum chamber of an electron beam coating apparatus. The chamber of the coating apparatus was evacuated to a residual pressure level in the range of $1.10^{-4}$–$5.10^{-5}$ Hg mm. After the proper level of vacuum was achieved, an electron beam was focused on the top side of the ingot to heat the surface layer up to 480° C. During this initial electron beam heating, the beam current was controlled so as to not exceed 0.08–0.1 A. To ensure even evaporation of the coating on the ingot, the electron beam was canned over the target, i.e., the coating layer on the top of the ingot, in accordance with a constant beam raster pattern. During evaporation, the beam power was increased to the range of 1.8–2.5 A. This resulted in the materials comprising the coating being evaporated at a rate commensurate with their respective vapor pressures at the evaporation temperature. When the coating was completely evaporated, the process was continued by evaporation of ceramic material from the ingot. Thus, the composition of the top region of the protective coating which condensed on the substrate was identical to the composition of the ingot. An evaporation time of 20–25 minutes resulted in the formation of a coating having a thickness in the range of 140–150 μm. This coating was characterized by the absence of an interface in the zone which corresponded to the completion of condensation of material from the layer deposited on the ingot and the condensation of the material which comprised the ingot itself. This absence of an identifiable interface causes a significant increase in the resistance of the coating on the substrate to damage resulting from repeated thermal cycles.

EXAMPLE 2 Al—$Al_2O_3$—$ZrO_2$ System

A three component mixture comprising 13%Al-7%$Al_2O_3$-80%($ZrO_2$-7%$Y_2O_3$), in the form of 6 g and 28 g pellets, was placed on the top side edge of partially stabilized zirconia $ZrO_2$-7%$Y_2O_3$ ceramic ingots (Ø70 mm) and the ingots placed into a water-cooled crucible. Condensation of electron beam evaporated material took place in the first case (6 g pellet) on a flat stationary substrate of EP-99 alloy. In the second case (28 g pellet) the vapor flow was condensed on rotating Hastelloy-X pins (Ø10 mm). X-ray spectral microanalyser (CAMEBAX) analysis revealed a typical gradient distribution of the components across the condensed coating thickness (FIG. 1). Concentrational curves of the component distribution show a smooth transition from Al to alumina and to zirconia. Metallographic study of the coating cross-sectional microstructure with a scanning electron microscope (CamScan) did not show the existence of flat interfaces between $Al_2O_3$ and $ZrO_2$ . $Y_2O_3$.

Figure 5:
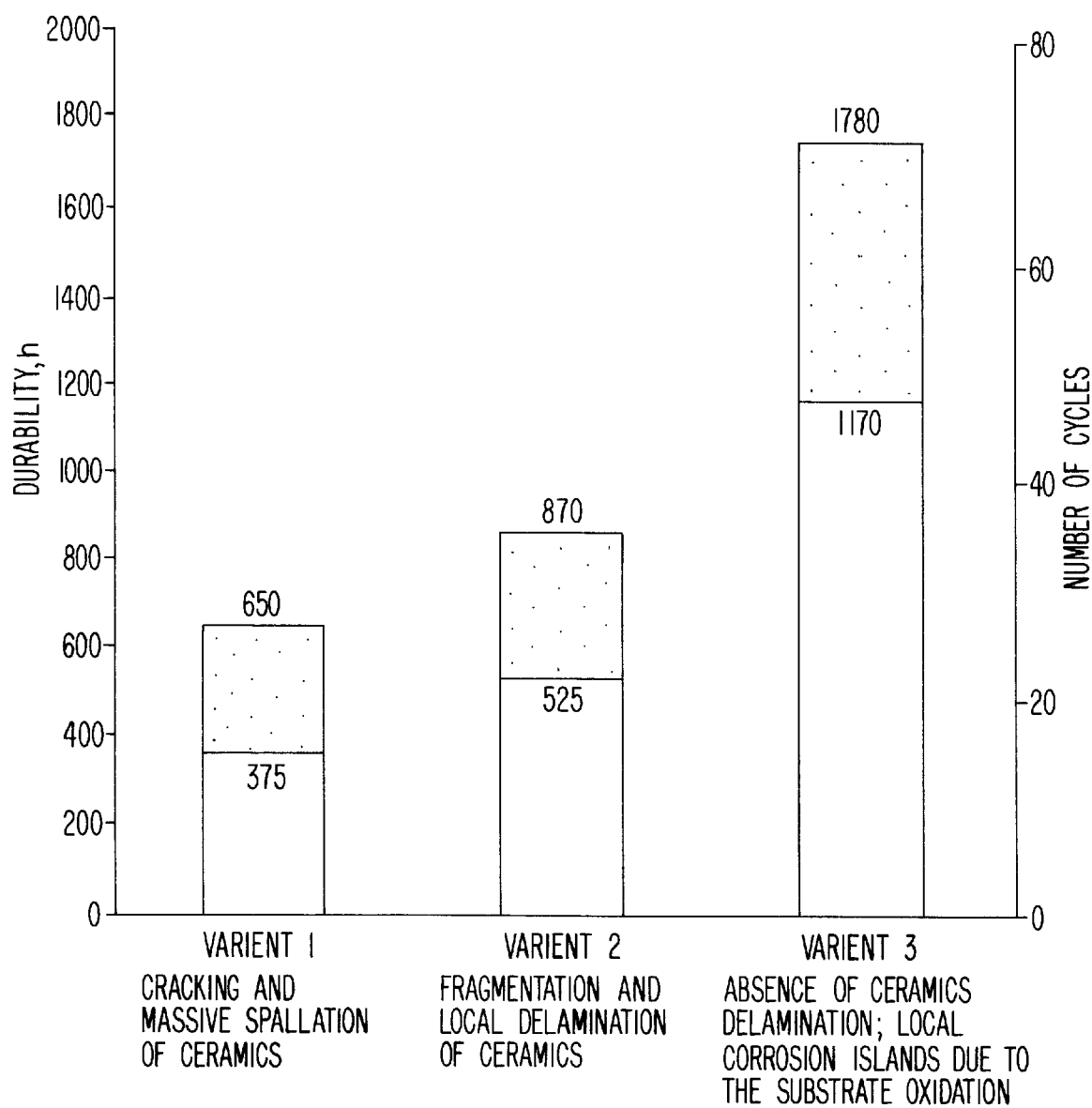
FIG. 5 shows the thermal cyclic durability of protective coatings in accordance with the invention which were deposited on 8 mm pins, the coatings having a gradient of chemical composition and structure across their thickness, the coatings being produced by sequential evaporation of pellets and a partially stabilized zirconia ZrO$_2$-7%Y$_2$O$_3$ ceramic ingot, the pellets of different chemical composition (Examples 1,2,3) having been placed at the top side of the ingot and evaporation having been executed from one crucible.

As shown in FIG. 5, pins with the gradient coating including the external ceramic layer were subjected to thermal cyclic life time tests per the mode 1135° C.⇌50° C., cycle time 24 h and $V_{cool}$=185° C./min.

An Al—$Al_2O_3$—$ZrO_2$ gradient coating has been successfully realized at zirconia content reduction until zero values (see Table 2). Al—$Al_2O_3$—$ZrO_2$ coatings can be effectively deposited to protect titanium alloys, BT-6C, for example.

The microstructural analysis results proved complete identify of the coatings obtained in Examples 1 and 2. However, in case of plasma spraying of the mixture of metals and oxides on the ingot, spitting of evaporated metal is more distinct at the transition of the coated layer-ceramic ingot boundary than at transition of the sintered pellet-ceramic ingot boundary.

EXAMPLE 3 Al—Si—$Al_2O_3$—Y—$Zr_2O_3$ System

Figure 2:
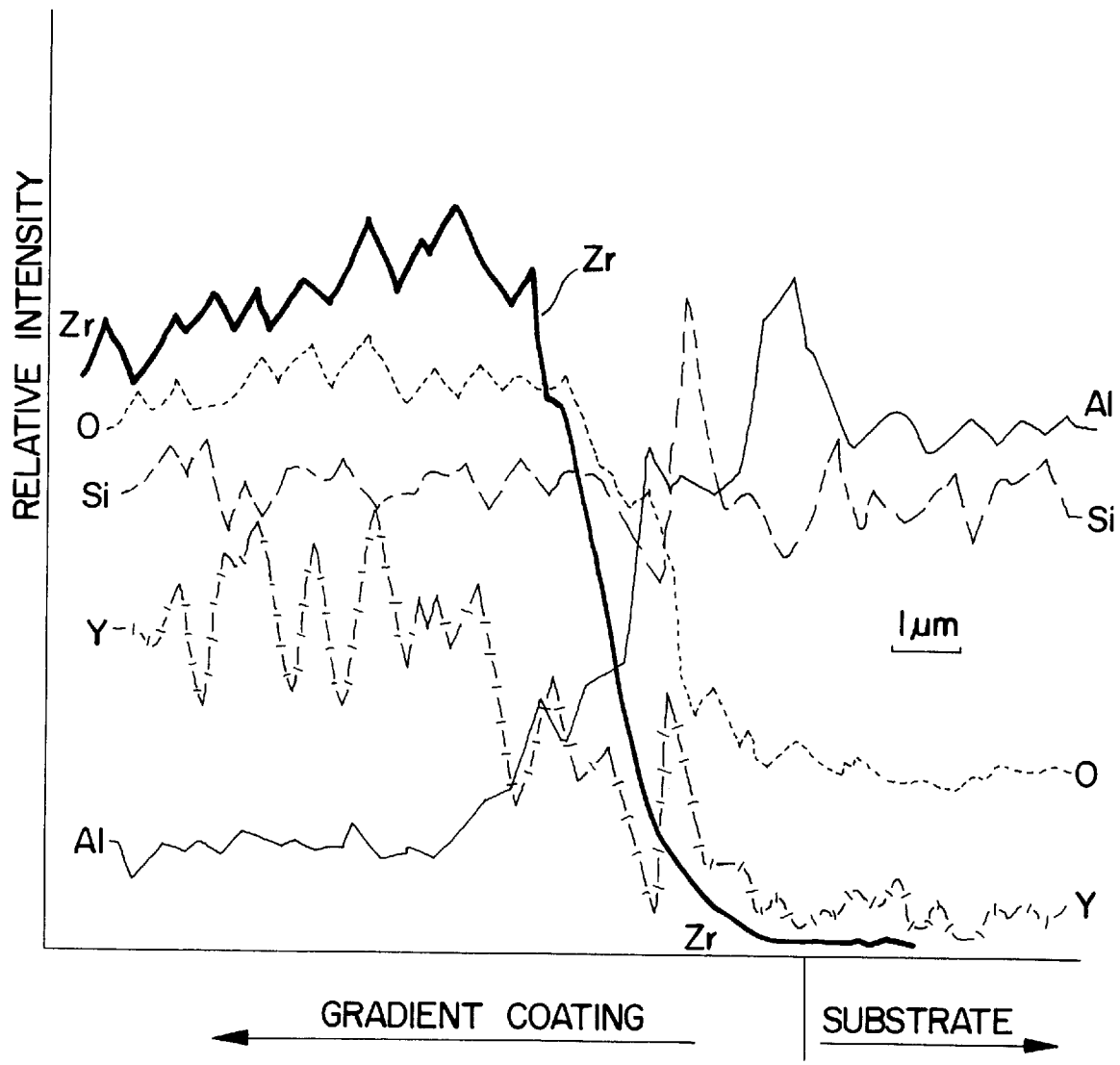
FIG. 2 shows an example of the element distribution curves of the separate components across the thickness of condensed protective coatings with gradient composition and structure produced by evaporation of a sintered pellet, the components of which are chosen in the proportion: 13%Al-1%Si-7%Al$_2$O$_3$-79%(ZrO$_2$-7%Y$_2$O$_3$), the pellet having been placed at the top side of a ZrO$_2$-7%Y$_2$O$_3$ ceramic ingot.

Silicon in the amount of 1–3% increases considerably the gas corrosion resistance of the coatings when used to protect turbine blades which may be exposed to contaminated fuel. The mixture of four components 13%Al-1%Si-7%$Al_2O_3$-79%($Zr_2O_3$-7%$Y_2O_3$), same as in Example 1, in the form of 6 g and 30 g pellets was evaporated in the sequence similar to Example 1. Compo nent distribution across the thickness of the condensed coating is shown in FIG. 2 (in this case gradient coatings were deposited on a substrate with a Ni-22Co-20Cr11Al—(Y) bond coat). Silicon is evaporated from the pellet immediately subsequent to the metallic aluminum and practically simultaneously with $Al_2O_3$.

As a result of evaporation of a pellet placed on a $Zr_2O_3$-7%$Y_2O_3$ ceramic ingot, no interfaces in the gradient coat were detectable and a top thermal barrier layer up to 125–130 μm thick was formed directly after zirconia evaporation from the pellet.

In this variant of gradient coating ceria can be used instead of alumina.

TABLE 2

Chemical composition (% per mass) of the pellets evaporated in the form of mixtures of metal powders and oxides to produce protective gradient coatings by vacuum condensation

| | Al—$Al_2O_3$—$ZrO_2$ system | | |
|---|---|---|---|
| Variant | Al | $Al_2O_3$ | $ZrO_2$ |
| 1.1. | 5 | 1 | rest |
| 1.2 | 13 | 7 | rest |
| 1.3 | 10 | 45 | rest |
| 1.4 | 30 | 56 | rest |
| 1.5 | 40 | 60 | 0 |

TABLE 2-continued

Chemical composition (% per mass) of the pellets evaporated in the form of mixtures of metal powders and oxides to produce protective gradient coatings by vacuum condensation

Al—Si—$Al_2O_3$—Y—$ZrO_2$ system

| Variant | Al | Si | $Al_2O_3$ | Y | $ZrO_2$ |
|---|---|---|---|---|---|
| 2.1. | 4.7 | 0.3 | 2 | 0.8 | rest |
| 2.2 | 13 | 1 | 7 | — | rest |
| 2.3 | 27 | 1 | 56 | 1.2 | rest |
| 2.4 | 14 | 1 | 83.5 | 1.5 | 0 |
| 2.5 | 17 | 3 | 5 | — | rest |

Al—Cr—Ni—$Al_2O_3$—Y—$ZrO_2$ system

| Variant | Al | Cr | Ni | $Al_2O_3$ | Y | $ZrO_2$ |
|---|---|---|---|---|---|---|
| 3.1. | 2 | 40 | — | 58 | — | 0 |
| 3.2 | 8 | 30 | — | 45 | 1 | rest |
| 3.3 | 8 | 25 | 33 | 3 | 1 | rest |
| 3.4 | 8 | 25 | — | 4 | 1.5 | rest |
| 3.5 | 10 | 10 | 26 | 5 | 1.0 | rest |
| 3.6 | 10 | 15 | 40 | 10 | 0.6 | rest |
| 3.7 | 13 | 16 | 40* | 3 | 1.2 | rest |
| 3.8 | 18 | 5 | 38 | 2 | 0.8 | rest |

Al—(Ni,Co)—Cr—$Al_2O_3$—Y—Pt—$ZrO_2$ system

| Variant | Al | Ni/Co | Cr | $Al_2O_3$ | Y | Pt | $ZrO_2$ |
|---|---|---|---|---|---|---|---|
| 4.1. | 8.5 | 25 | | 10 | — | 1 | 0.5 | rest |
| 4.2 | 5 | 30 | | 20 | 7.5 | 1.5 | 1.0 | rest |
| 4.3 | 12 | 45 | 20 | 18 | 32.5 | 1 | 1.5 | 0 |
| 4.4 | 4 | 40 | | 25 | 5 | 0.5 | 2.5 | rest |
| 4.5 | 10 | | 30 | 15 | 2 | 0.5 | 0.8 | rest |
| 4.6 | 8 | | 40 | 15 | 2.5 | 0.8 | 1.7 | rest |
| 4.7 | 5 | | 45 | 20 | 3 | 0.6 | 1.2 | rest |
| 4.8 | 8 | 30 | 35 | 20 | 5 | 1.0 | 1.0 | 0 |

*60% Ni + 40% Co

EXAMPLE 4 Al—Cr—Ni—$Al_2O_3$—Y—$ZrO_2$ System

The mixture of components containing 8%Al-25%Cr-33%Ni-3%$Al_2O_3$-1%Y-30%($ZrO_2$-7%$Y_2O_3$) in the form of 15 g and 45 g pellets was evaporated under direct action of an electron beam as described above and condensed on stationary substrates.

Figure 3:
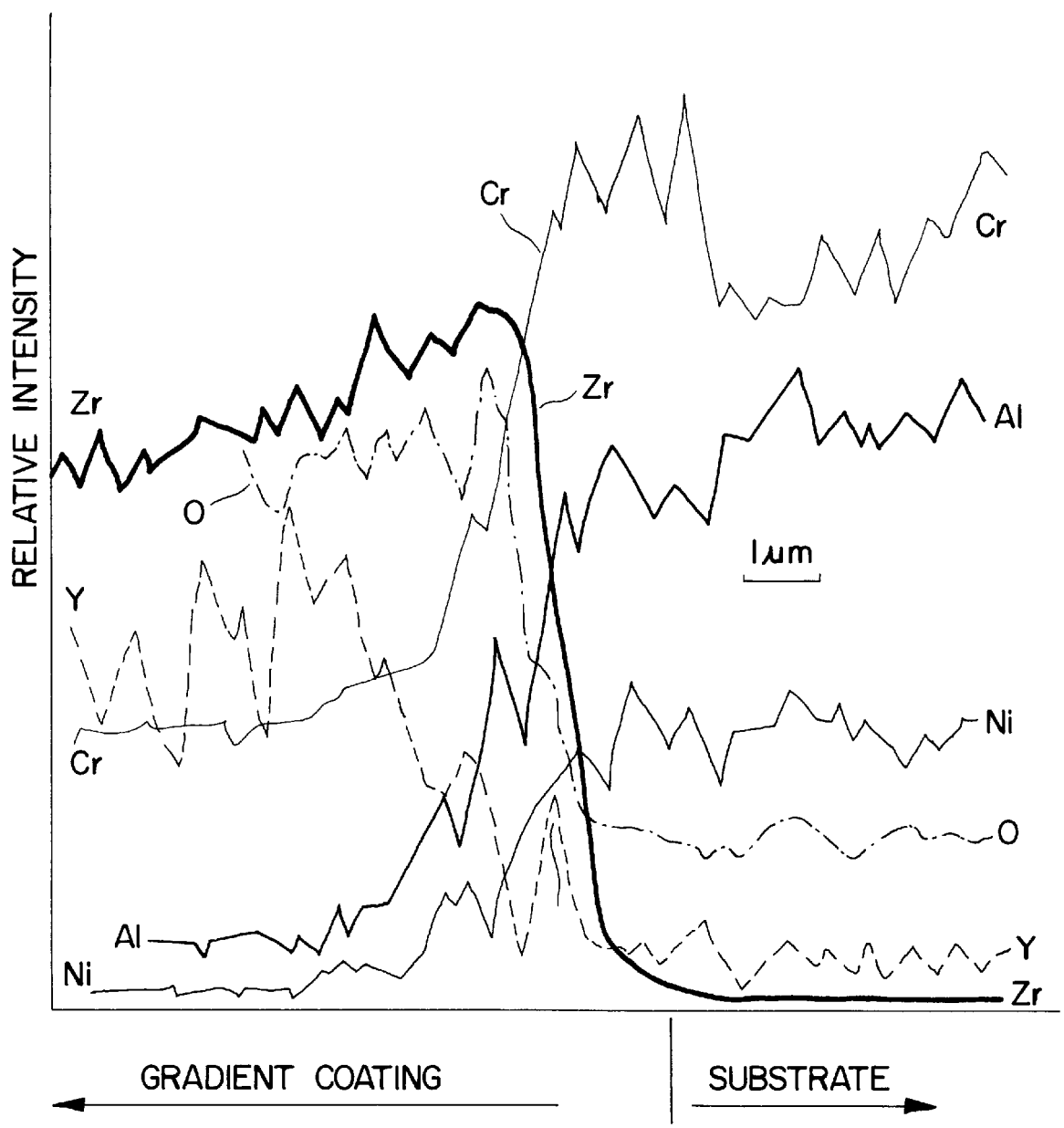
FIG. 3 shows an example of the element distribution curves of the separate components across the thickness of condensed protective coatings with gradient composition and structure produced by evaporation from a crucible of a sintered pellet whose components are chosen in the proportion: 8%Al-25%Cr-33%Ni-3%Al$_2$O$_3$-1%Y-30%(ZrO$_2$-7%Y$_2$O$_3$), the pellet having been placed at the top side of a ZrO$_2$-7%Y$_2$O$_3$ ceramic ingot.

FIG. 3 shows component distribution across the thickness of the gradient coating obtained by the sequential pellet and $ZrO_2$-7%$Y_2O_3$ ingot evaporation. A typical peak corresponding to alumina with a smooth transfer into zirconia is observed. Yttrium maximal concentration is observed in the curve's branch of zirconia concentration growth in the external layer of the gradient coating. The data in FIG. 3 confirm the absence of sharp interfaces between separate zones of the coating across the thickness.

Thermal cyclic test data of specimen pins (FIG. 5) confirms the practical applicability of such a coating system. In case of the pellet and $ZrO_2$-7%$Y_2O_3$ ceramic ingot evaporation from one source, when the pellet was placed at the ingot top side in one evaporator, no ceramic spalling from thermal barrier layer in the conventional form was observed. After 1070 h tests corrosion damage center (Ø2–3 mm) have appeared in the TBC.

Localized slowly progressing corrosion of the gradient coating under the ceramic layer (total damaged area being not more than 5–6%) was obtained at the pin surface after ~1800 h test (after that the tests were terminated).

The durability of the condensed ceramic $ZrO_2$-7%$Y_2O_3$ TBCs on gradient coatings produced according to the invention from one source are two-three times higher than the durability of two layer metal/ceramics coatings produced per standard industrial technology.

EXAMPLE 5 Al—(Ni,Co)—Cr—$Al_2O_3$—Y—Pt—$ZrO_2$ System

Figure 4:
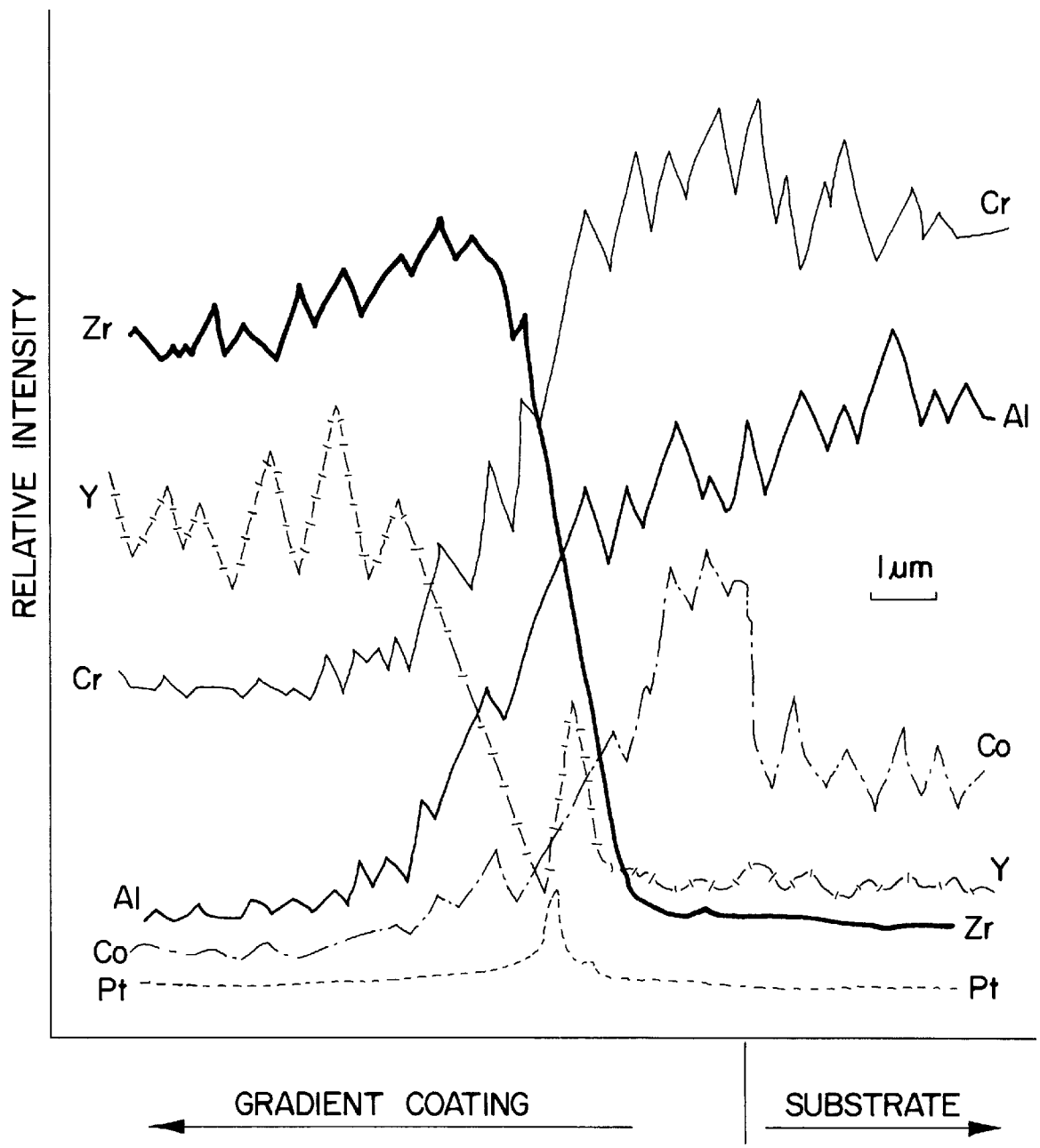
FIG. 4 shows an example of the element distribution curves of the separate components across the thickness of condensed protective coatings with gradient composition and structure produced by evaporation of a sintered pellet whose components are chosen in the proportion: 8%Al-40%Co-15%Cr-2.5%Al$_2$O$_3$-0.8%Y- 1.7% Pt-32%(ZrO$_2$-7%Y$_2$O$_3$), the pellet having been placed at the top side of a ZrO$_2$7%Y$_2$O$_3$ ceramic ingot.

Platinum was introduced into the mixture (pellet) to be evaporated as a component for increasing oxidation resistance of the protective coating. 15 g pellets were evaporated from a copper water-cooled crucible and condensed on a stationary substrate. The initial mixture contained: 8%Al-40%Co-15%Cr-3%$Al_2O_3$-1%Y-30%($ZrO_2$-7%$Y_2O_3$). Curves of separate element distribution in the gradient coat containing platinum were obtained by X-ray spectral microanalysis and are shown in FIG. 4. These curves demonstrate platinum presence in the "layer" adjacent to $ZrO_2$ top layer. Such Pt containing coatings can be recommended for surface protection in oxidizing and erosion-active gas flows. Condensation of a thick $ZrO_2$ ceramic layer transforms these coatings into thermal barrier coatings.

The present invention is applicable to provide a protective coating on a substrate, the coating having a smooth chemical composition and structure gradient across its thickness and having a top ceramic layer. Such a coating insures high quality and reliability of a protective TBC and is particularly useful when increased corrosion resistance is required under conditions of frequent thermal cycles.

While preferred embodiments have been described, various modifications and substitutions thereto may be implemented without departing from the spirit and scope of the invention. Accordingly, the present invention has been described by way of illustration and not limitation.

What is claimed is:

1. In a method for producing a protective coating having a chemical composition and structure gradient across its thickness and a ceramic outer layer, the coating being formed on a substrate, the method including:

heating the substrate in a vacuum;

heating a ceramic ingot in the vacuum with an electron beam to evaporate material from the ingot; and condensing the material evaporated from the ingot on the heated substrate;

the improvement comprising:

applying a mixture of materials on the surface of the ingot which is to be impinged upon by the electron beam, the mixture comprising metals or alloys and oxides with different vapor pressures at the evaporation temperature of the ingot, whereby the mixture is electron beam heated, evaporated and condensed on the substrate prior to the evaporation of the material from the ceramic ingot.

2. The method of claim 1, wherein the mixture of materials is applied to the surface of the ceramic ingot by a chemical-metallurgical process.

3. The method of claim 1, wherein the mixture of materials is in the form of a pressed and vacuum annealed metallic-ceramic pellet placed on the ceramic ingot.

4. The method of claim 1 wherein the ceramic ingot is comprised of stabilized zirconia and the mixture of materials is a system comprising Al—$Al_2O_3$—$ZrO_2$.

5. The method of claim 2 wherein the ceramic ingot is comprised of stabilized zirconia and the mixture of materials is a system comprising Al—$Al_2O_3$—$ZrO_2$ .

6. The method of claim 3 wherein the ceramic ingot is comprised of stabilized zirconia and the mixture of materials is a system comprising Al—$Al_2O_3$—$ZrO_2$.

7. The method of claim 4 wherein the constituents of the system are present in the following proportions by weight:

Al—5 to 40%
$Al_2O_3$—1 to 60%
$ZrO_2$—the remainder.

8. The method of claim 1 wherein the ceramic ingot is comprised of stabilized zirconia and said mixture of materials is a system comprising Al—Si—$Al_2O_3$—Y—$ZrO_2$.

9. The method of claim 2 wherein the ceramic ingot is comprised of stabilized zirconia and said mixture of materials is a system comprising Al—Si—$Al_2O_3$—Y—$ZrO_2$.

10. The method of claim 3 wherein the ceramic ingot is comprised of stabilized zirconia and said mixture of materials is a system comprising Al—Si—$Al_2O_3$—Y—$ZrO_2$.

11. The method of claim 8 wherein the constituents of the system are present in the following proportions by weight:

Al—5 to 40%
Si—0.3 to 3%
$Al_2O_3$—3 to 84%
Y—0 to 1.5%
$ZrO_2$—the remainder.

12. The method of claim 1 wherein the ceramic ingot is comprised of stabilized zirconia and the mixture of materials is a system comprising Al—Cr—Ni—$Al_2O_3$—Y—$ZrO_2$.

13. The method of claim 2 wherein the ceramic ingot is comprised of stabilized zirconia and the mixture of materials is a system comprising Al—Cr—Ni—$Al_2O_3$—Y—$ZrO_2$.

14. The method of claim 3 wherein the ceramic ingot is comprised of stabilized zirconia and the mixture of materials is a system comprising Al—Cr—Ni—$Al_2O_3$—Y—$ZrO_2$.

15. The method of claim 12 wherein the constituents of the system are present in the following proportions by weight:

Al—2 to 18%
Cr—5 to 40%
Ni—0 to 40%
$Al_2O_3$—2 to 58%
Y—0 to 1.5%
$ZrO_2$—the remainder.

16. The method of claim 1 wherein the ceramic ingot is comprised of stabilized zirconia and the mixture of materials is a system comprising Al—Cr—(Ni,Co)—$Al_2O_3$—Y—Pt—$ZrO_2$.

17. The method of claim 2 wherein the ceramic ingot is comprised of stabilized zirconia and the mixture of materials is a system comprising Al—Cr—(Ni,Co)—$Al_2O_3$—Y—Pt—$ZrO_2$.

18. The method of claim 3 wherein the ceramic ingot is comprised of stabilized zirconia and the mixture of materials is a system comprising Al—Cr—(Ni,Co)—$Al_2O_3$—Y—Pt—$ZrO_2$.

19. The method of claim 16 wherein the constituents of the system are present in the following proportions by weight:

Al—4 to 12%
Cr—10 to 25%
Ni—25 to 45%
Co—25 to 45%
$Al_2O_3$—1 to 60%
Y—0.5 to 2.5
Pt—0.5 to 2.5
$ZrO_2$—the remainder.

20. The method of claim 1 wherein the mixture of materials is uniformly blended and includes the following constituents:

Al;
$Al_2O_3$; and
a metal oxide having the same composition as the ingot.

* * * * *